United States Patent
Zhang

(10) Patent No.: US 10,283,622 B1
(45) Date of Patent: May 7, 2019

(54) EXTENDED DRAIN TRANSISTOR ON A CRYSTALLINE-ON-INSULATOR SUBSTRATE

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/872,939

(22) Filed: Jan. 16, 2018

(51) Int. Cl.
*H01L 29/66* (2006.01)
*H01L 29/06* (2006.01)
*H01L 29/78* (2006.01)

(52) U.S. Cl.
CPC .... *H01L 29/66689* (2013.01); *H01L 29/0623* (2013.01); *H01L 29/7824* (2013.01)

(58) Field of Classification Search
None
See application file for complete search history.

(56) References Cited

U.S. PATENT DOCUMENTS

2015/0380402 A1* 12/2015 Park .................... H01L 29/7835
257/337

* cited by examiner

*Primary Examiner* — Fernando L Toledo
*Assistant Examiner* — Lawrence-Lin T Nguyen
(74) *Attorney, Agent, or Firm* — Thompson Hine LLP; Anthony Canale

(57) ABSTRACT

A high voltage (HV) transistor is integrated on a silicon-on-insulator (SOI) substrate. The HV transistor is disposed in a HV device region disposed on a bulk substrate of the SOI substrate. The HV device region includes a top field oxide which includes at least a part of a buried oxide (BOX) of the SOI substrate. A HV gate is disposed in HV region overlapping the HV top field oxide and includes first and second HV gate sidewalls. A drain is disposed on the bulk substrate and displaced from the first HV gate sidewall by the HV top field oxide. A source is disposed on the bulk substrate adjacent to the side of the second HV gate sidewall.

20 Claims, 7 Drawing Sheets

US 10,283,622 B1

EXTENDED DRAIN TRANSISTOR ON A CRYSTALLINE-ON-INSULATOR SUBSTRATE

TECHNICAL FIELD

The present disclosure relates generally to semiconductor devices. In particular, the disclosure relates to an extended drain metal oxide semiconductor (EDMOS) integrated on silicon-on-insulator (SOI) substrates.

BACKGROUND

Silicon-on-insulator (SOI) substrates, such as fully depleted SOI (FDSOI) or radio frequency SOI (RFSOI) are used for various integrated circuit (IC) applications. Such SOI substrates include a thin surface crystalline or silicon layer separated from the bulk substrate by a buried oxide (BOX). Typically, IC applications include high voltage (HV) transistors, such as extended drain metal oxide semiconductor (EDMOS) transistors. However, the thin surface substrate of SOI substrates, such as RFSOI and FDSOI, are not amenable to accommodate HV transistors, such as EDMOS. This results in difficulties in integrating HV transistors on SOI substrates. For example, conventional techniques for integrated HV transistors on SOI substrates require complex processing to make them compatible. Complex processing results in increased cost.

The present disclosure is directed to HV transistors, such as EDMOS which are easily integrated on SOI substrates, such as RFSOI or FDSOI substrates.

SUMMARY

Embodiments of the present disclosure generally relate to a semiconductor device and method for forming a semiconductor device. In one embodiment, a device is disclosed. The device includes a silicon-on-insulator (SOI) substrate having a surface substrate, a buried oxide (BOX) below the surface substrate, and a bulk substrate below the BOX. The device also includes a high voltage (HV) device region and a HV top field oxide disposed on the bulk substrate. The HV top field oxide includes at least a part of the BOX. The device further includes a HV transistor disposed in the HV device region having a HV gate with first and second HV gate sidewalls, and first and second HV source/drain (S/D) regions disposed in the bulk substrate. The HV gate is disposed on a bulk surface of the bulk substrate and overlaps the HV top field oxide, while the first HV S/D region is displaced away from the first HV gate sidewall by the HV top field oxide and the second HV S/D region is adjacent to the second HV gate sidewall.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments generally relate to semiconductor devices or integrated circuits (ICs). More particularly, some embodiments relate to high voltage (HV) devices. For example, HV devices include extended drain (ED) transistors, such as extended drain metal-oxide-semiconductor field-effect transistors (MOSFETs) or EDMOS transistors. The HV EDMOS transistors can be employed, for example, as switching voltage regulators for power management applications. Other uses for EDMOS transistors may also useful. The EDMOS transistors can be easily integrated into devices or ICs. The devices or ICs can be incorporated into or used with, for example, consumer electronic products, and particularly portable consumer products, such as cell phones, laptop computers and personal digital assistants (PDAs).

Figure 1:
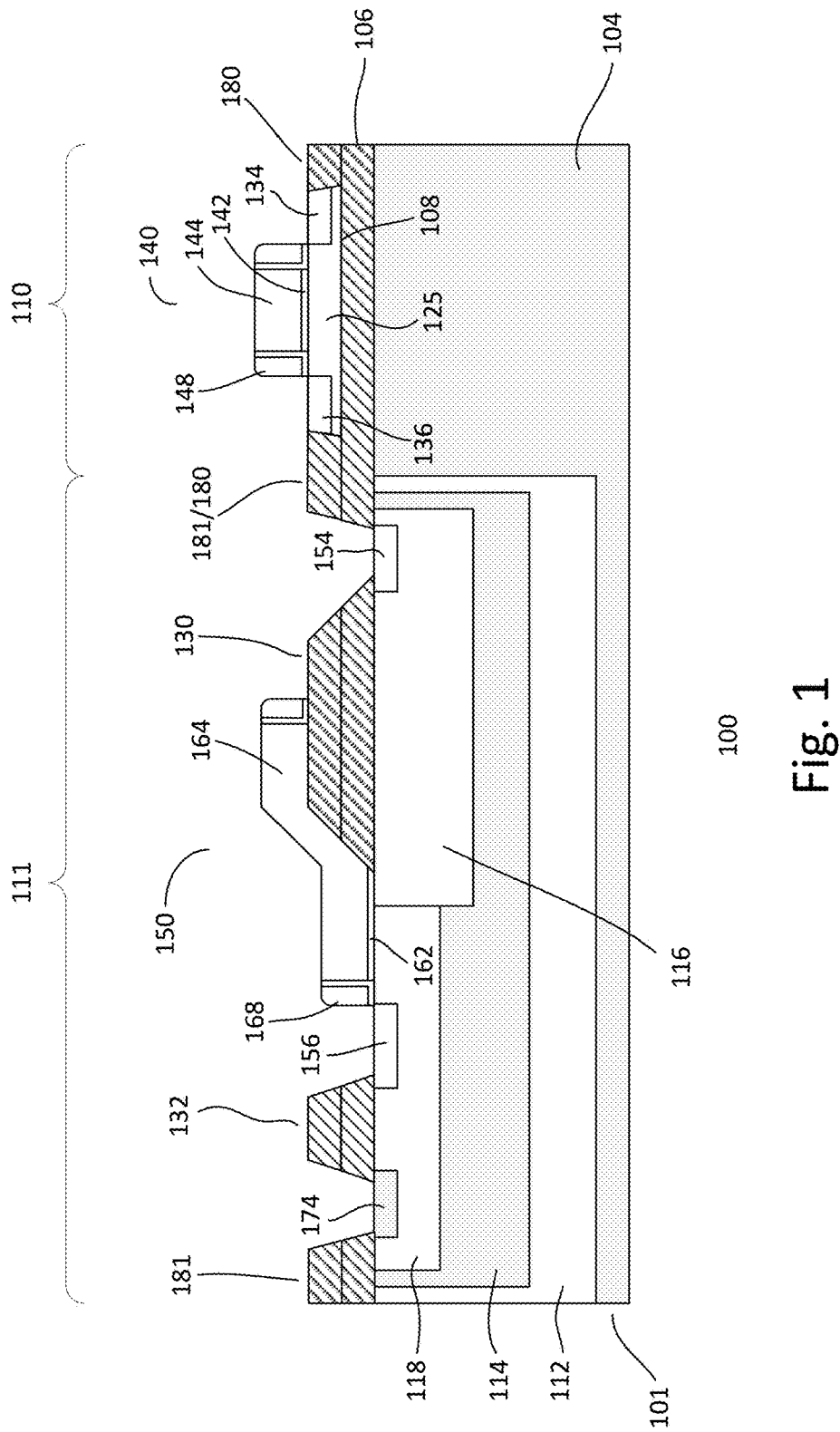
FIG. 1 shows a simplified cross-sectional view of an embodiment of a device.

FIG. 1 shows a cross-sectional view of a portion of a device 100. The device, for example, is an IC. Other types of devices may also be useful. As shown, the device includes a substrate 101. The substrate is a crystalline-on-insulator (COI) substrate. The COI substrate may be a silicon-on-insulator (SOI) substrate. In one embodiment, the substrate is a fully depleted SOI (FDSOI) substrate with a thin buried oxide (BOX) insulator. For example, the FDSOI substrate includes a thin silicon surface substrate 108 and a bulk silicon substrate separated by a thin BOX 106. The thickness of the surface substrate may be about 5-10 nm while the thickness of the BOX may be about 10-30 nm. The surface substrate and BOX may have other thicknesses. Other types of COI substrates may also be useful. For example, the SOI wafer may be a partially depleted SOI (PDSOI), or high resistivity SOI substrate.

The surface and bulk substrates may be doped. For example, the surface and bulk substrate may be lightly or intermediately doped with p-type dopants. The dopant concentration of the substrates, for example, may be about 1E11-1E13 dopants/cm$^2$. Doping the substrates with other types of dopants or dopant concentrations may also be useful.

The substrate includes first and second device regions 110 and 111 on the substrate. The first device region may be a core device region. The core device region includes a core transistor 140. A core transistor may be an input/output (I/O) transistor or other types of core transistors. As for the second device region, it is a high voltage (HV) device region with a EDMOS transistor 150. Although the substrate is shown with one core device region and one HV device region, it is understood that the substrate may include many core device regions and HV device regions. In addition, other types of device regions may also be included. For example, the substrate may include other core device regions as well as a memory array region.

The substrate may include numerous doped regions and wells. The doped regions may have different dopant polarity types, such as p-type and n-type as well as different depths and different dopant concentrations. For example, the device may include heavily doped (x$^+$), intermediately doped (x) and lightly doped (x$^-$) regions, where x is the polarity type which can be p or n. A lightly doped region may have a dopant concentration of about 1E11-1E13 dopants/cm$^2$, an intermediately doped region may have a dopant concentration of about 1E13-1E15 dopants/cm$^2$, and a heavily doped region may have a dopant concentration of about 1E15-1E17 dopants/cm$^2$. Providing other dopant concentrations for the different doped regions may also be useful. The dopant concentrations, for example, may depend on the technology node and design requirements. P-type dopants may include boron (B), aluminum (Al), indium (In) or a combination thereof, while n-type dopants may include phosphorous (P), arsenic (As), antimony (Sb) or a combination thereof.

In one embodiment, the first device region is disposed on the surface substrate. For example, the core device region with the core transistor is disposed on the surface substrate. The core device region includes a core device doped well 125 in the surface substrate. The core device doped well, in one embodiment, is a second polarity type doped well for a first polarity type core transistor. In the case of a n-type transistor, the core device doped well is a p-type doped well. In the case of a p-type transistor, the core device doped well is a n-type doped well. The doped well may be a lightly or intermediately doped with second polarity type dopants. The core device well extends from the surface to the bottom of the surface substrate. For example, the core device well encompasses the complete thickness of the surface substrate. It is understood that the device may include numerous core device regions with n-type and p-type core transistors. For example, numerous p-type and n-type device wells may be provided in the surface substrate.

The surface substrate may be provided with isolation region 180. The isolation region may be shallow trench isolation (STI) region. A STI region includes an isolation trench filled with isolation or dielectric materials. The isolation material of the STI region may be referred to as ST dielectric or oxide (STO). Other types of isolation regions may also be useful. The isolation region isolates the core device regions from other regions on the surface substrate. In one embodiment, the isolation region surrounds the core device region. The isolation region extends from the surface to the bottom of the surface substrate, isolating the device region from other device regions. To ensure that the doped well is completely isolated, the bottom of the isolation region may extend into the BOX. Other isolation regions may be provided for isolation other device regions on the surface substrate.

The core transistor includes a core gate 140 disposed on the surface of the surface substrate in the core device region between first and second core source/drain (S/D) regions 134 and 136 in the surface substrate. The core gate includes a core gate electrode 144 over a core gate dielectric 142. The gate electrode may be polysilicon and the gate dielectric may be thermal silicon oxide. The gate electrode may be doped with, for example, first polarity type dopants. Other types of electrodes and dielectrics may also be useful. The core gate electrode serves as a core gate terminal of the core transistor.

As for the S/D regions, they are heavily doped first polarity S/D regions for a first polarity type transistor. For example, the S/D regions are n-type heavily doped regions for a n-type transistor. Providing p-type S/D regions for a p-type transistor may also be useful. The S/D regions may include lightly doped (LD) extension regions. The LD extension regions, for example, extend under the gate while offset spacers 148 are provided on sidewalls of the gate to displace the S/D regions away from the gate. As shown, a spacer may include an oxide spacer lining the sidewall and bottom of the substrate and a nitride spacer disposed on the oxide spacer. Other configurations of offset spacers may also be useful. The spacers on the gate of the core transistor may be referred to as core gate spacers.

As for the HV device region, it is disposed on the bulk substrate. For example, a surface substrate and a portion of the BOX are removed to expose the surface of the bulk substrate in the HV device region. The HV device region includes a HV device isolation region 181. The HV isolation region may be an HV isolation oxide. The HV isolation region defines the HV device region. For example, the HV isolation region surrounds the HV device region. The HV device region may have a rectangular shape having a length and a width. The length direction, for example, is in a channel length direction and the width direction is in a channel width direction. In one embodiment, the HV isolation region includes lower and upper isolation portions. The lower portion includes oxide from the BOX and the upper portion includes STO.

In one embodiment, a top field isolation 130 disposed on the surface of the bulk substrate. The field isolation is similar to the HV isolation region. For example, the field isolation includes lower and upper portions include oxides of the BOX and STI. The HV device region may also include a contact isolation 132. The contact isolation also is similar to the top field isolation. The top field isolation and contact isolation may also be referred to as top field oxide or contact oxide. As shown, the device isolation region and contact and field isolations include slanted sidewalls to reduce electric field crowding. The field oxide and contact oxide both extend across the width of the device region.

In one embodiment, a thickness of the field oxide can be tailored based on design or operating requirements. For example, the field oxide may be tuned based on gate bias and drain bias voltages requirements. The top field oxide thickness may be about the same as or greater or less than the height of the surface substrate. For example, the top field oxide thickness may be the same as or greater or less than the thickness of the HV oxide. In the case that the top field oxide thickness is greater than the height of the surface substrate, additional oxide may be deposited prior to patterning to form the top field oxide. In the case that the top field oxide thickness is less than the height of the surface substrate, a selective etch may be employed to thin down the top field oxide. For example, the selective etch may be employed prior to patterning the top field oxide. Depending on the thickness requirement of the top field oxide, the STI oxide may be partially or completely removed. In addition, part of the BOX may also be removed so that the thickness of the field oxide is less than a thickness of the BOX. The top field oxide, as such, includes at least a part of the BOX. For example, the top field oxide may include a part of the BOX, the BOX, the BOX and some parts of the STI oxide, the BOX and the STI oxide, or the BOX, the STI oxide and addition top up oxide.

In one embodiment, a device doped well 114 is disposed in the device region. The device doped well, for example, serves as a HV device doped well. The HV device doped well extends under the HV isolation region and may have a depth of about 3-5 µm. Other depths may also be useful. The HV device doped well is a second polarity type doped well. The HV device well may be lightly doped with a dopant concentration of about 1E11-1E13 dopants/cm$^2$. Other dopant concentrations may also be useful.

A HV transistor is disposed in the device region over the HV device well. The HV transistor, in one embodiment, is an extended drain metal oxide semiconductor (EDMOS) transistor. The transistor includes a HV gate 150 between first and second HV S/D regions 154 and 156. The HV gate, for example, includes a HV gate electrode 164 over a HV gate dielectric 162. The HV gate dielectric may be a thermal oxide gate dielectric and the gate electrode may be a polysilicon gate electrode. Other types of gate dielectrics and electrodes may also be useful. The polysilicon gate electrode may be a doped polysilicon gate electrode. For example, the gate electrode may be doped with first polarity type dopants. Doping the gate electrode with other types of dopants may also be useful. The HV gate includes first and second sidewalls. The first S/D region is adjacent to the first sidewall and the second S/D region is adjacent to the second gate sidewall.

In one embodiment, the HV gate and core gate are derived from the same gate layers. For example, the gate layers are formed on the substrate and are patterned to form both the HV gate and core gate. Other configurations of HV and core gates may also be useful.

The HV gate, as shown, overlaps the field oxide. For example, the gate includes a first overlapping portion which overlaps the field oxide and a second or non-overlapping portion which is disposed on the bulk substrate. Such overlapping arrangement of the first and second overlapping portions is to reduce potential high electrical field crowding at the edges of the polysilicon gate electrode, thereby reducing damages to the top field oxide. In addition, high electrical field may be shifted away from the channel and distribute more evenly to reduce hot carrier generation and device breakdown and performance reliability. As for the HV gate dielectric, it is disposed in the bulk substrate under the gate electrode in the non-overlapping portion of the HV gate.

In one embodiment, a thickness of the HV gate dielectric can easily be tailored to a desired thickness for the HV transistor. The thickness may depend on the voltage application. In one embodiment, a thickness range of the HV transistor gate dielectric is equal to a thickness of the core transistor gate dielectric and greater. In the case the thickness is equal to the thickness of the core transistor, it can be derived from the same gate dielectric layer. For example, the HV gate dielectric may be formed in the same process as the cored gate dielectric. On the other hand, if the desired thickness of the gate dielectric is greater than the core gate dielectric, the HV gate dielectric may be a composite gate dielectric having a lower and upper HV gate dielectric. The lower HV gate dielectric may include oxide of the BOX and the upper HV gate dielectric may include the core gate dielectric.

As for the HV S/D regions, they are first polarity type doped regions for a first polarity type HV transistor. The second polarity type HV device well serves as a device well for the first polarity type HV transistor. In one embodiment, the first polarity type is n-type for a n-type HV transistor. Providing p-type S/D regions may also be useful for p-type HV transistors. The first polarity type doped S/D regions are heavily doped with first polarity type dopants. The dopant concentration of the S/D regions may be about 1E15-1E17 dopants/cm$^2$. Other dopant concentrations may also be useful. The first S/D region may serve as a drain terminal and the second S/D region may serve as a source terminal.

In one embodiment, the first HV S/D region is displaced from the first sidewall of the HV gate by the field oxide. For example, the first HV S/D region is disposed in the bulk substrate between the field oxide and HV device isolation region. As for the second HV S/D region, it is disposed in the bulk substrate adjacent to the second sidewall of the HV gate. As shown, the second HV S/D region is disposed between the second sidewall of the gate and contact isolation region.

The second HV S/D region may include a HV lightly doped (LD) extension region. The LD extension regions, for example, extend under the HV gate while a HV gate offset spacer 168 on the second HV gate sidewall displaces the second HV S/D regions away from the gate. As shown, a spacer may include an oxide spacer lining the sidewall and bottom of the substrate and a nitride spacer disposed on the oxide spacer. Other configurations of offset spacers may also be useful. The HV gate sidewall spacer may be similar to the core gate sidewall spacers. A HV gate spacer may also be disposed on the first HV gate sidewall on the field oxide. The HV and core gate spacers may be the same type of spacers. For example, the HV and core gate spacers may be formed in the same process or processes.

The HV device well may include a HV body well 118. The HV body well is a second polarity type doped well. For example, the HV body well may be intermediately doped with a dopant concentration of about 1E13-1E15 dopants/cm$^2$. The dopant concentration of the HV body well is heavier than then HV device well, which can reduce the channel length without punch-through. Other dopant concentrations will also be useful. Alternatively, the HV device well may not include the HV body well at all. The body well encompasses the second HV S/D region and extends under the HV gate. As shown, the body well extends to under the non-overlapping portion of the HV gate. The body well extends sufficiently under the HV gate to serve as a channel of the HV transistor. For example, the body well extends to near the field oxide. Extending the body well to other distances under the non-overlapping portion of the gate may also be useful. A depth of the body well may be about 0.5-1 µm. Providing a body well having other depths may also be useful.

The HV device well may also include a drift well 116. The drift well is a first polarity type doped well disposed within the HV device well. The drift well may be a lightly doped first polarity type doped well. For example. The dopant concentration of the drift well may be about 1E11-1E13 dopants/cm$^2$. Other dopant concentrations may also be useful. The drift well encompasses the first HV S/D region and extends under the field oxide to under the non-overlapping portion of the gate and abuts the body well. The drift well couples the first HV S/D region to the gate. The depth of the drift well may be about 0.5-2 µm. For example, the depth of the drift well is deeper than the body well. Other configurations of drift and body wells may also be useful.

A HV substrate contact 174 may be disposed on the bulk substrate. The substrate contact, as shown, is disposed between the HV isolation region and contact field oxide. The substrate contact, in one embodiment, is a heavily doped second polarity type contact region. The substrate contact, for example, may be similar to a second polarity type S/D region of a second polarity type transistor of the device. The substrate contact may be coupled to a substrate bias, such as ground, for biasing the HV device well. Biasing the substrate with other bias voltages may also be useful.

In one embodiment, the HV region includes a deep isolation well 112. For example, the HV region includes a HV isolation well. The HV isolation well encompasses the device well. The HV isolation well includes first polarity type dopants, isolating the second polarity type device well from the substrate. The HV isolation well may be a lightly doped well. For example, the dopant concentration of the HV isolation well may be about 1E11-1E13 dopants/cm$^2$.

Other dopant concentrations may also be useful. A depth of the isolation well maybe about 5-10 μm. Providing an HV isolation well having other depths may also be useful.

Metal silicide contacts (not shown) may be provided for various terminal or contact regions of the device. For example, metal silicide contacts may be provided for S/D regions, gate terminals and substrate contacts. The silicide contact may be a nickel-based silicide contact. For example, the silicide contact may be formed of nickel or nickel alloy.

A back-end-of-line (BEOL) dielectric (not shown) may be disposed on the substrate. For example, the BEOL covers the surface substrate, including HV and core transistors as well as devices in other device regions. The BEOL dielectric may include a plurality of ILD levels. An ILD level includes a metal level dielectric over a contact level dielectric. The metal and contact level dielectrics may be silicon oxide. For example, the silicon oxide may be TEOS formed by chemical vapor deposition (CVD). Providing low k dielectrics for the metal and contact level dielectrics or a combination of low k and TEOS dielectrics may also be useful. The BEOL dielectric may include dielectric etch stop liners between ILD levels or between metal level and contact level dielectrics. Other configurations of BEOL dielectrics may also be useful.

Generally, a metal level dielectric includes conductors or metal lines while the contact level dielectric includes via contacts. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

As discussed, the BEOL includes a plurality of ILD levels. For example, x number of ILD levels may be provided. As illustrated, the device includes 8 ILD levels (x=8). Other numbers of ILD levels may also be useful. The numbers of ILD levels may depend on, for example, design requirement or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels. Interconnections to the devices of the various device regions on the substrate are provided by the conductors and contacts in the ILD levels of the BEOL dielectric.

FIGS. 2a-2f show simplified cross-sectional views of an embodiment of a process 200 for forming a device. The device, for example, is similar to that described in FIG. 1. Common elements may not be described or described in detail.

Figure 2A:
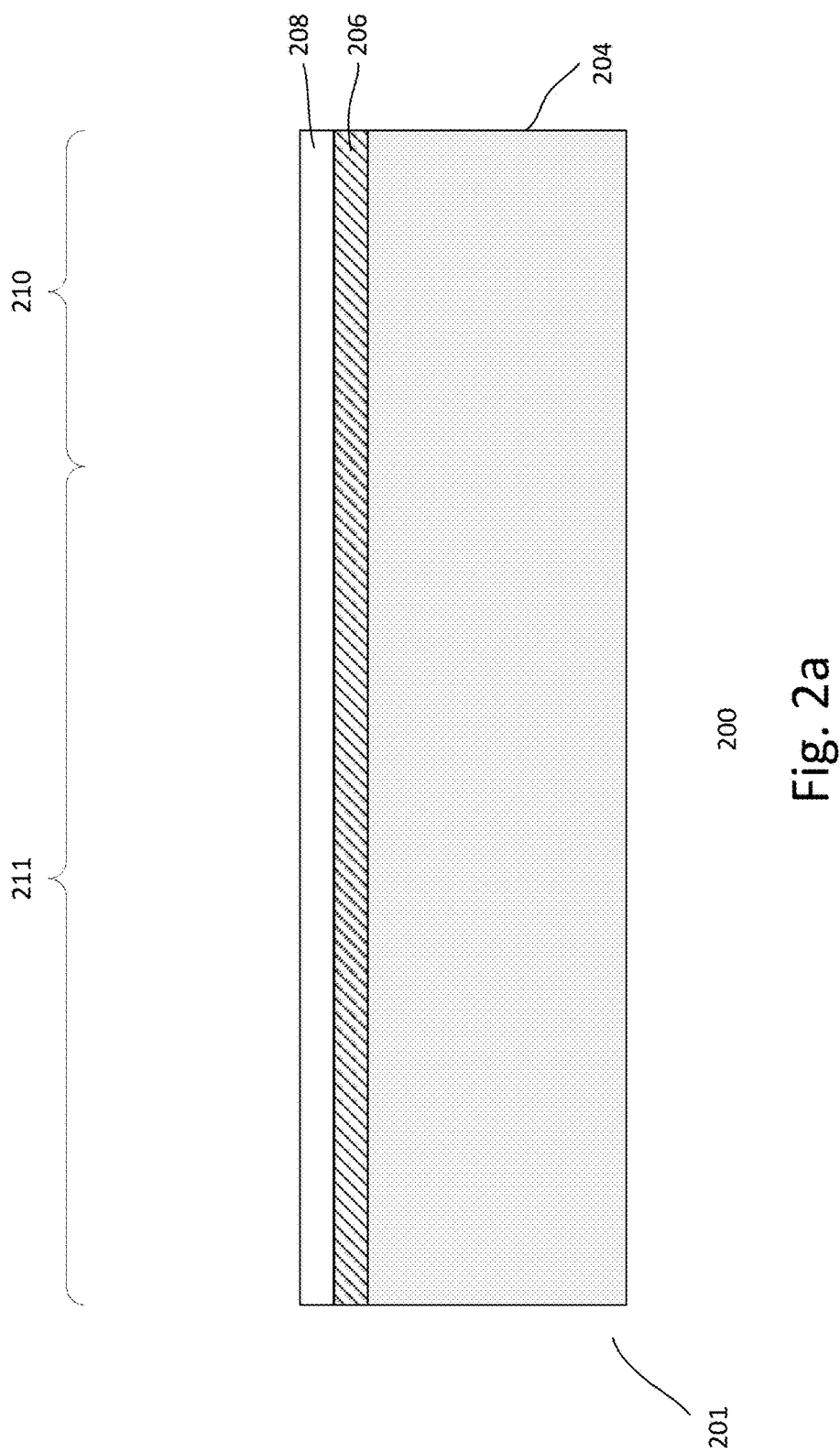
FIGS. 2a-2f show cross-sectional views of an embodiment of a process for forming a device.

Referring to FIG. 2a, a substrate 201 on which the device is formed is provided. The device, for example, is an IC. Other types of devices may also be useful. In one embodiment, the substrate is a COI substrate, such as a SOI substrate. The COI substrate includes a surface substrate 208 and a bulk substrate 204 separated by a BOX 206. In one embodiment, the substrate is a fully depleted FDSOI substrate. Other types of COI substrates may also be useful. For example, the SOI wafer may be a PDSOI or high resistivity SOI substrate. In one embodiment, the surface substrate may be an ultra-thin surface substrate having a thickness of about 5-10 nm and the BOX is an ultra-thin BOX having a thickness of about 10-30 nm. Other thicknesses for the surface substrate and BOX may also be useful. The surface and bulk substrates may be doped. For example, the surface and bulk substrate may be lightly or intermediately doped with p-type dopants. Doping the substrates with other types of dopants or dopant concentrations may also be useful.

The substrate includes first and second device regions 210 and 211 on the substrate. The first device region may be a core device region. The core device region includes a core transistor. A core transistor may be an input/output (I/O) transistor or other types of core transistors. As for the second device region, it is a high voltage (HV) device region with a EDMOS transistor. Although the substrate is shown with one core device region and one HV device region, it is understood that the substrate may include many core and HV device regions. In addition, other types of device regions may also be included. For example, the substrate may include other core device regions as well as a memory array region. In other embodiment, the core device region may include low voltage (LV) and intermediate/medium voltage (MV) devices and memory cells.

Figure 2B:
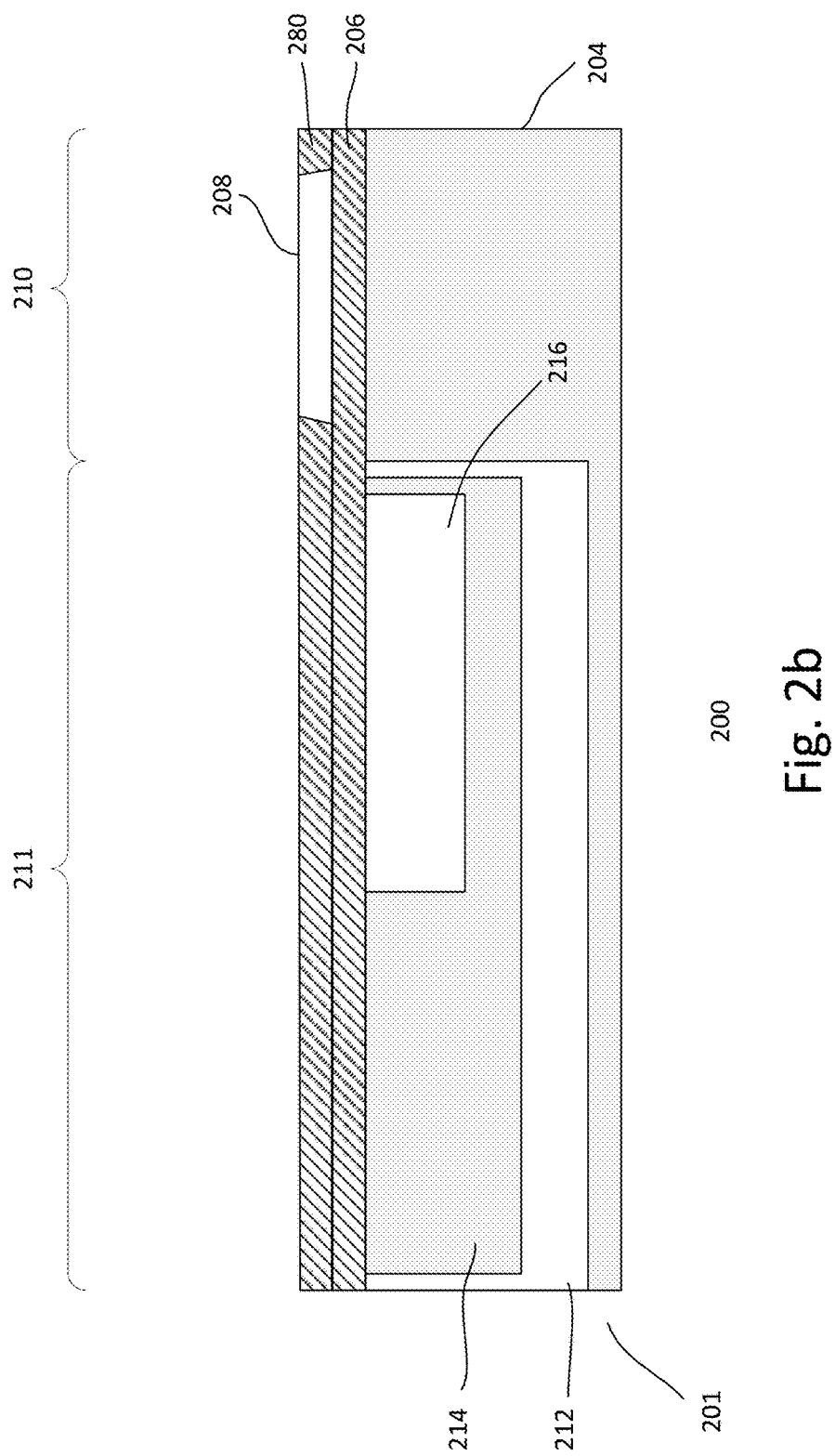

In FIG. 2b, the substrate is processed to define the core device region. Defining the core device region includes forming a core isolation region 280 surrounding the core device region. For example, the core isolation region surrounds the surface substrate 208 which serves as the core device region. In one embodiment, the core isolation region is a core shallow trench isolation (STI) region. The core STI region extends at least a complete depth of the surface substrate. As shown, an isolation region extends through the surface substrate and slightly into the bulk substrate, ensuring complete isolation of the core device region. The process also includes pre-defining the HV device region. Pre-defining the HV device region includes forming a HV isolation region over the HV region. The HV isolation region may be a HV STI region.

Various processes may be employed to form the STI regions. For example, the substrate can be etched using etch and mask techniques to form trenches which are then filled with dielectric materials such as silicon oxide. Chemical mechanical polishing (CMP) may be performed to remove excess oxide and provide a planar substrate top surface. Other processes can also be used to form the STIs. Other types of isolation regions are also useful. For example, the STI regions may be formed by local oxidation of silicon (LOCOS).

After forming the STI regions, doped wells are formed in the HV region. For example, a HV isolation well 212, a HV device well 214 and a HV drift well 216 are formed in the bulk substrate in the HV device region.

In one embodiment, the HV isolation well 212 is sufficiently deep to isolate the device well from the substrate. The HV isolation well encompasses the complete HV device region and may have a depth of about 5-10 μm. Providing an HV isolation well having other depths may also be useful. The HV isolation well includes first polarity type dopants. The HV isolation well may be a lightly doped well. For example, the dopant concentration of the HV isolation well may be about 1E11-1E13 dopants/cm². Other dopant concentrations may also be useful.

As for the HV device doped well 214, it is disposed in the device region within the isolation well. The HV device doped well encompasses the HV device region and may have a depth of about 3-5 μm. Other depths may also be useful. The HV device doped well is a second polarity type doped well. The HV device doped well may be lightly doped with a dopant concentration of about 1E11-1E13 dopants/cm². Other dopant concentrations may also be useful.

The HV drift well 216 is disposed in the HV device well and serves to provide connection of a drain of a HV transistor to a non-overlapping portion of an HV gate. The drift well is a first polarity type doped well and may be a lightly doped first polarity type doped well. For example. The dopant concentration of the drift well may be about 1E11-1E13 dopants/cm². Other dopant concentrations may also be useful. The depth of the drift well may be about 0.5-2 µm. For example, the depth of the drift well is deeper than the body well. Other configurations of drift and body wells may also be useful.

The various wells are formed using different implant processes. In one embodiment, the implant is performed through the trench isolation oxide and BOX. An implant process implants dopants into the bulk substrate using an implant mask, such as a photoresist mask. The implant mask exposes a portion of the substrate which the well is formed. In one embodiment, the deeper wells are formed prior to shallower wells. For example, the HV isolation well is formed first, followed by the HV device well and then the HV drift well. In some cases, multiple implant processes may be performed to form a well. Multiple implant processes may be useful for deep wells, such as the deep isolation well. Forming the wells using a single implant process may also be useful.

Figure 2C:
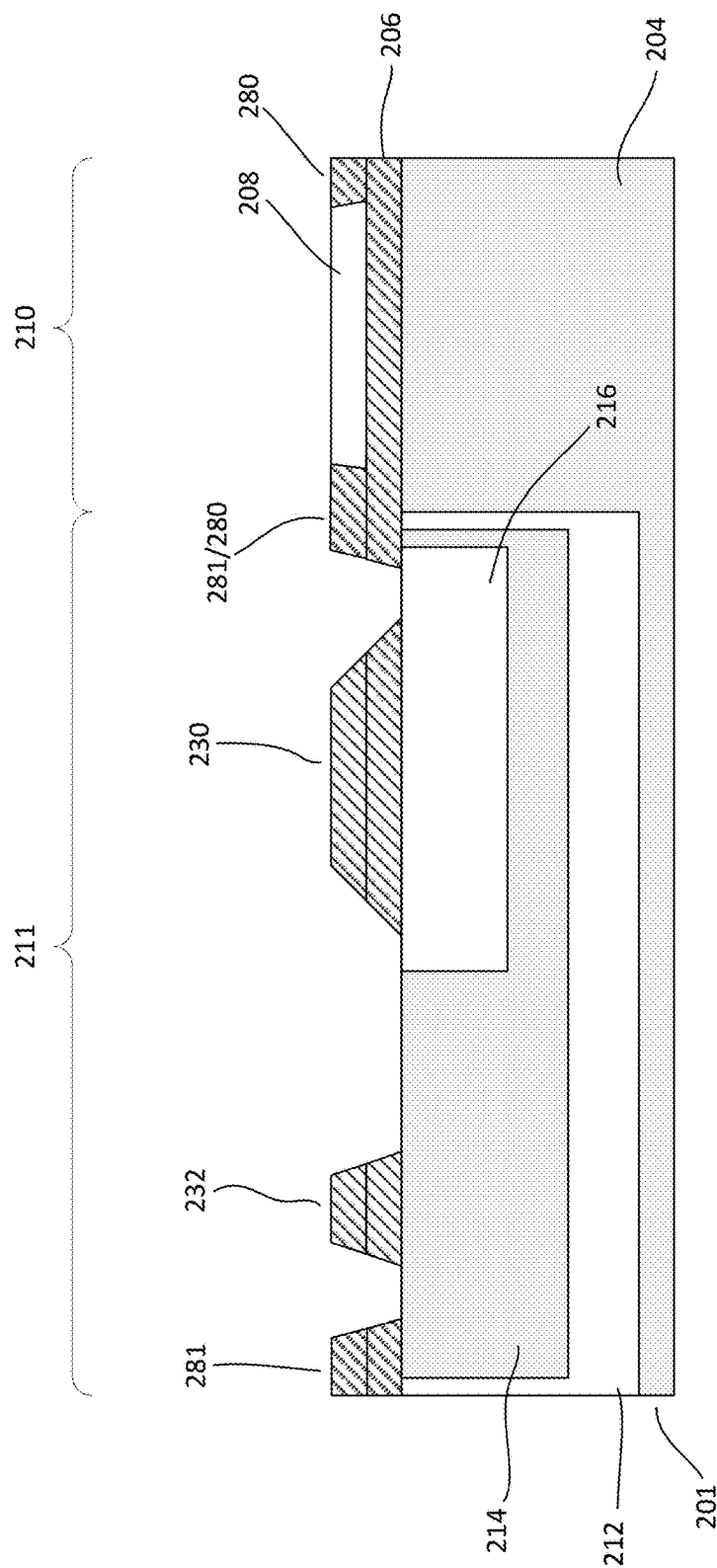

Referring to FIG. 2c, the process continues to define the HV device region. In one embodiment, defining the HV device region includes patterning the HV trench isolation to form HV isolation region 281. The HV isolation region surrounds the HV device region. In one embodiment, patterning the HV trench isolation to form the HV isolation region also forms a field oxide 230 and a contact oxide 232 in the HV device region. As shown, the field oxide is disposed over the HV drift well. As for the contact oxide, it is disposed over the HV device well. The patterning, as shown, forms structures with slanted sidewall profiles.

As discussed, the top field oxide thickness may be about the same as or greater or less than the height of the surface substrate, or in some instances, the thickness of the HV isolation. In the case that the top field oxide thickness is greater than the height of the surface substrate, addition oxide may be deposited prior to patterning to form the HV isolation, top field oxide and contact oxide. After deposition, the additional oxide may be selectively removed in regions outside of the top field oxide region. The process then proceeds to pattern the HV isolation region, top field oxide and contact oxide. Selective removal may be achieved by an etch using a mask. In the case that the top field oxide thickness is less than the thickness of the HV isolation region, a selective etch may be employed to thin down the top field oxide. For example, the selective etch may be employed prior to patterning to form the HV isolation, top field oxide and contact oxide. The selective etch may employ a mask. Depending on the thickness requirement of the top field oxide, the STI oxide may be partially or completely removed. In addition, part of the BOX may also be removed so that the thickness of the field oxide is less than a thickness of the BOX. The top field oxide, as such, includes at least a part of the BOX. For example, the top field oxide may include a part of the BOX, the BOX, the BOX and some parts of the STI oxide, the BOX and the STI oxide, or the BOX, the STI oxide and addition top up oxide.

Figure 2D:
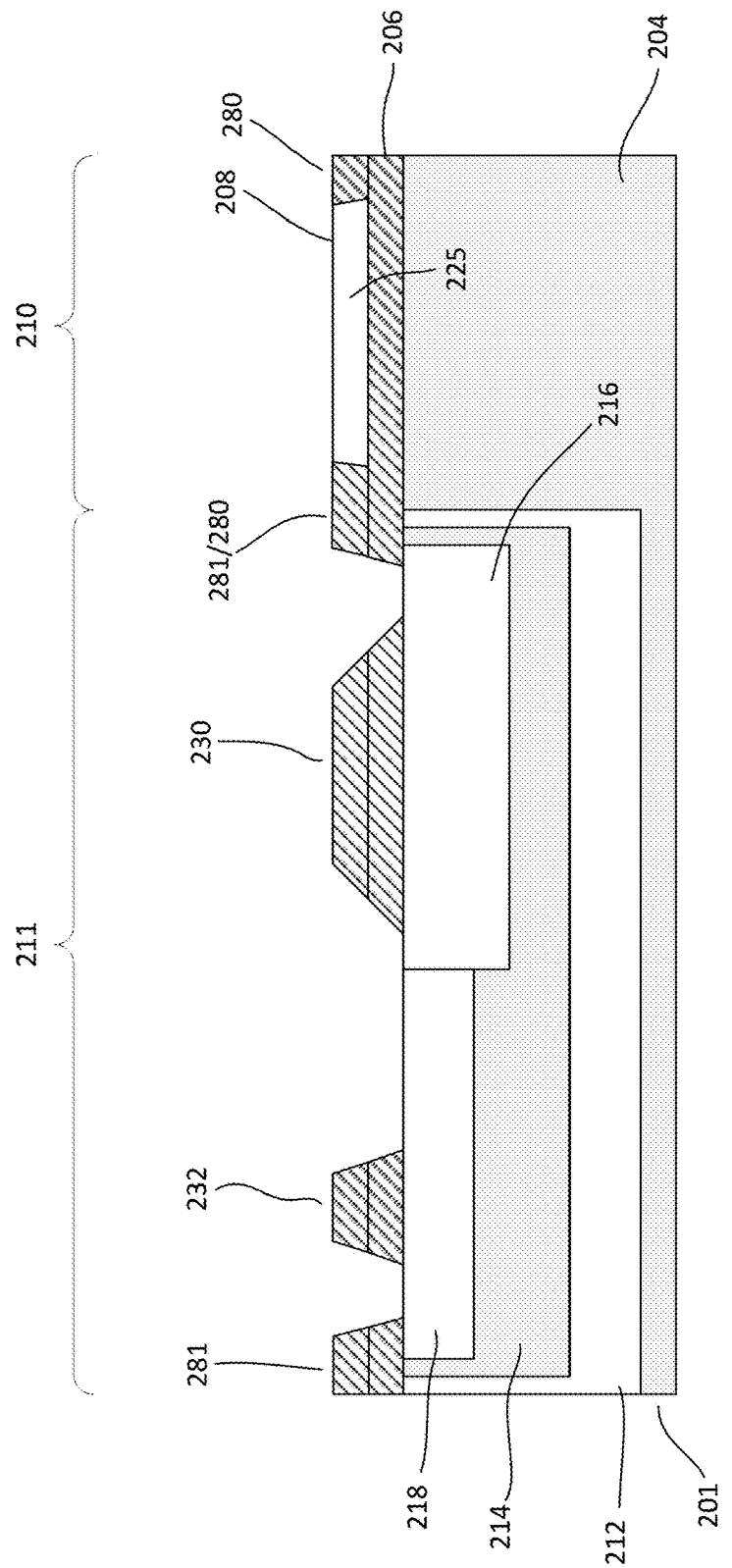

In FIG. 2d, the process forms a core device well 225 in the core device region and HV body well 218 in the HV device region. The core device well and HV body well are second polarity type wells. The wells, for example, are intermediately doped second polarity type doped wells. For example, the dopant concentration of the wells may be about 1E13-1E15 dopants/cm². Other dopant concentrations may also be useful. In one embodiment, the wells are formed using the same implant process. For example, second polarity type dopants are implanted using an implant mask which exposes the core device region and a portion of the HV device region where the body well is to be formed.

Figure 2E:
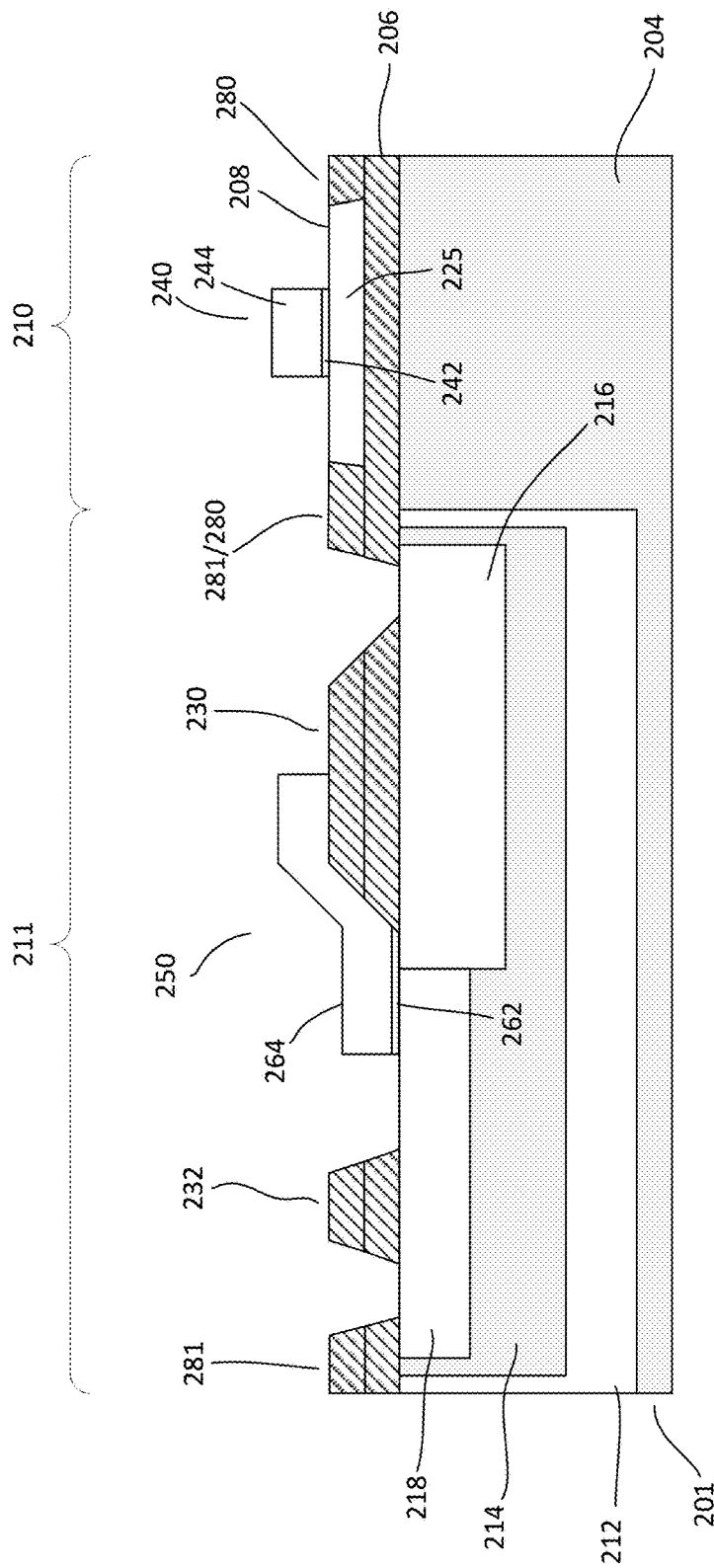

Referring to FIG. 2e, a HV gate 250 is formed in the HV region and a core gate 240 is formed in the core device region. Forming the gates includes forming gate layers of the transistors on the substrate. The gate layers, for example, cover the substrate, including the HV and core device regions as well as other device regions. In one embodiment, the gate layers include a gate dielectric and a gate electrode. The gate dielectric may be a silicon oxide layer formed by thermal oxidation while the gate electrode may be a polysilicon layer formed by chemical vapor deposition (CVD). The electrode layers may be doped with first polarity type dopants. Doping the electrode layers may be achieved by ion implantation or by in-situ doping. The thickness of the gate dielectric layer may be about 20-200 Å and the thickness of the gate electrode layer may be about 1000-3000 Å. Other thicknesses may also be useful.

In one embodiment, the gate dielectric layer may be tailored for the core transistor. For example, the thickness of the gate dielectric layer is formed to a thickness of the core transistor. In such cases, the thickness of the gate dielectric layer may be the same for both the HV and core transistors. In other embodiments, the thickness of the HV gate dielectric may be thicker than the core gate dielectric. For example, a thicker gate dielectric may be used for the HV transistor while a thinner gate dielectric may be used for the core transistor.

In one embodiment, tailoring the gate dielectric to be thicker for the HV transistor can easily be achieved by using a portion of the BOX and the gate dielectric to serve as the HV gate dielectric. For example, when patterning the trench isolation layer to define the HV device region, a portion of it remains to serve as a lower portion of the HV gate dielectric. For example, the remaining portion is equal to about difference in thickness of the HV gate dielectric and core gate dielectric. After forming the gate dielectric layer, the HV gate dielectric would have a desired thickness while the core gate dielectric has a thickness equal to the gate dielectric layer.

After the gate layers are formed on the substrate, it is patterned to form the HV and core gates. Patterning the gate layers is achieved using mask and etch techniques. For example, a patterned resist mask is provided form an anisotropic etch, such as a reactive ion etch (RIE). The etch removes exposed portions of the gate layers, leaving the HV and core gates in the HV and core device regions. Patterning the gate layers may also form gates in other device regions. The HV gate includes a HV gate electrode 264 over a HV gate dielectric 262 while the core gate includes a core gate electrode 244 over a core gate dielectric 242. As shown, the HV gate overlaps the field oxide. For example, the HV gate includes a non-overlapping portion on the bulk substrate and an overlapping portion disposed on the field oxide. Patterning the gate layers exposes S/D regions and contact region on the HV region and S/D regions in the core region.

Figure 2F:
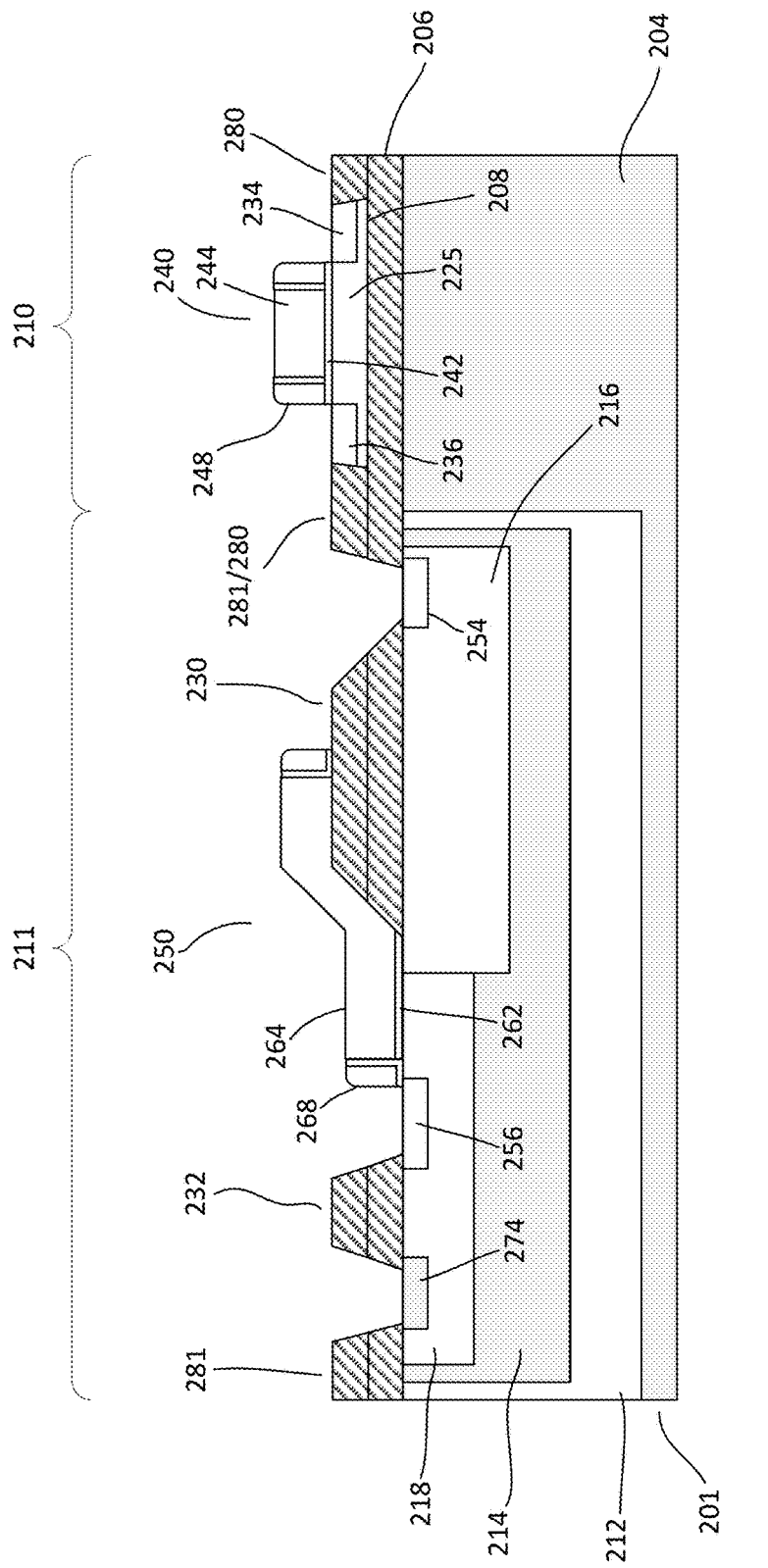

Referring to FIG. 2f, the process continues to form the HV and core transistors. In one embodiment, LD extension regions are formed in the S/D regions of the transistors. The LD extension regions, for example, are lightly doped first polarity regions. To form LD extension regions, an implant mask exposing the S/D regions is used for a lightly doped first polarity type implant. The implant implants first polarity type dopants to forms the LD extension regions in the S/D regions. The LD extension regions, for example, are aligned with sidewalls of the gates. The LD extension regions may extend slightly under the gates. An LD extension region may also be provided for the first S/D region of the HV transistor. The implant may also form LD extensions for other first polarity type transistors and contact regions. A second polarity type LD implant may be performed to form second polarity type LD extensions for second polarity type transistors and contact regions.

After forming the LD extension regions, gate sidewall spacers may be formed. For example, HV sidewall spacers 268 and core sidewall spacers 248 are formed. The sidewall spacers may be formed in the same process using the same layer or layers. In one embodiment, forming the sidewall spacers includes forming a first and second spacer layers on the substrate. The first spacer layer may be a silicon oxide layer formed by CVD and the second spacer layer may be silicon nitride formed by CVD. The thickness of the first spacer layer may be about 100 Å while the second spacer layer may be about 500-1000 Å. Other types of or thicknesses for the spacer layers may also be useful. An anisotropic etch, such as RIE, is performed. The etch removes horizontal portions of the spacer layers, leaving HV sidewall spacers on the HV gate sidewalls and core sidewall spacers on the core gate sidewalls. Sidewalls may also form on gates of other device regions.

First polarity type S/D regions are formed on the substrate in the HV and core device regions. The first polarity type S/D regions are heavily doped regions. For example, first and second HV S/D regions 254 and 256 are formed in the HV region and first and second core S/D regions 234 and 236 are formed in the core device regions. The first and second core S/D regions and the second HV S/D region are displaced from the gate sidewalls by the gate sidewall spacers. As for the first HV S/D region, it is displaced from the HV gate by the field oxide. However, the drift well provides a connection for the first S/D region to the gate. Forming the S/D regions is achieved by an implant using an implant mask. For example, the implant exposes the S/D regions, enabling the implant to implant first polarity type dopants to form the first polarity type S/D regions. The implant may also form first polarity type S/D regions and contact regions in other device regions.

A heavily doped second polarity type contact 274 is formed in the HV contact region. For example, an implant may be performed to form the second polarity type contact in the HV contact region. The implant may also be used to form second polarity type S/D regions for second polarity type transistors and other second polarity type contacts in other device regions.

The process may continue to form metal silicide contacts on various terminals of the transistors and substrate contacts in the device regions. For example, metal silicide contacts may be provided for S/D regions, gate terminals and substrate contacts. The metal silicide contact may be a nickel-based silicide contact. For example, the silicide contact may be formed of nickel or nickel alloy. To form metal silicide contacts, a metal layer is formed over the substrate and annealed to cause a reaction with the metal and exposed silicon surfaces. The reaction forms metal silicide. Excess unreacted metal is removed by, for example, a wet etch.

The process may continue to form the device. For example, Back-end-of-line (BEOL) processes may be performed to form BEOL dielectric with a plurality of ILD levels, as previously discussed, to form interconnections to the terminals of the memory cell. Additional processes are performed to complete the IC. These processes include, for example, final passivation, dicing and packaging. Other processes may also be included.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
   a crystalline-on-insulator (COI) substrate, the COI substrate comprising a surface substrate, a bulk substrate, and a buried oxide (BOX) layer disposed between the surface substrate and the bulk substrate, the BOX layer isolating the surface substrate from the bulk substrate;
   a high voltage (HV) device region on the COI substrate, wherein the HV device region is disposed on the bulk substrate below the surface substrate and BOX layer;
   a HV top field oxide disposed on a top bulk substrate surface of the bulk substrate in the HV device region, wherein the HV top field oxide comprises at least a part of the BOX layer; and
   a HV transistor disposed in the HV device region, the HV transistor including:
      a HV gate having a first HV gate sidewall and a second HV gate sidewall, the HV gate disposed in the HV device region, wherein a second contiguous gate portion of the HV gate which includes the second HV gate sidewall is disposed on the top bulk substrate surface of the bulk substrate and a first contiguous gate portion of the HV gate which includes the second HV gate sidewall overlaps onto a portion of the HV top field oxide,
      wherein the HV gate conforms to a topography of the HV device region created by the top field oxide in which the first gate portion comprises a first gate portion top surface above a second gate portion top surface,
      a first HV source/drain (S/D) region disposed in the HV device region of bulk substrate and displaced away from the first HV gate sidewall by the HV top field oxide, and
      a second HV S/D region disposed in the bulk substrate adjacent to the second HV gate sidewall.

2. The device of claim 1, wherein the HV device region comprises:
   a HV isolation region, the HV isolation region surrounding the HV device region and comprising lower and upper HV isolation portions, wherein
      the upper HV isolation portion comprises a part of a core trench isolation oxide used to fill a core trench isolation region surrounding a core device region on the surface substrate, and
      the lower HV isolation portion comprises a part of the BOX layer.

3. The device of claim 1 comprises:
a core device region in the surface substrate which is above the HV device region in the bulk substrate;
a core device isolation region, wherein the core device isolation region surrounds the core device region and extends from a top surface of the surface substrate to the BOX layer; and
a core device disposed in the core device region, wherein the core device comprises a core gate between first and second core S/D regions.

4. The device of claim 2, wherein the top field oxide comprises:
a lower top field oxide portion, wherein the lower top field oxide portion is formed by the BOX layer; and
an upper top field oxide portion, wherein the upper top field oxide portion is formed by the core trench isolation oxide used in forming the core trench isolation region.

5. The device of claim 1, wherein the HV gate comprises:
a HV gate oxide; and
a HV gate electrode disposed over the gate oxide.

6. The device of claim 5, wherein the HV gate oxide comprises a gate oxide which is used for a core gate oxide of a core gate in a core device region on the surface substrate.

7. The device of claim 6, wherein the HV gate oxide comprises a same thickness as the core gate oxide.

8. The device of claim 5, wherein the HV gate oxide comprises:
a lower HV gate oxide portion which is part of a lower portion of the BOX layer; and
an upper HV gate oxide portion comprising a gate oxide which is used for a core gate oxide of a core gate in a core device region on the surface substrate to produce a thicker HV gate oxide which is thicker than the core gate oxide.

9. The device of claim 1 comprising:
a HV body well disposed in the bulk substrate, wherein the HV body well encompasses the second HV S/D region and extends under the gate;
a drift well disposed in the bulk substrate, wherein the drift well encompasses the first HV S/D region and extends under the HV top field oxide and under the HV gate to the HV body well; and
wherein a channel of the HV transistor extends from the second HV S/D to the drift well, and wherein the drift well provides coupling of the first HV S/D region which is displaced away from the HV gate by the HV top field oxide to the channel.

10. The device of claim 9, comprising:
a HV device well, wherein the HV device well is disposed in the bulk substrate and encompasses the HV body well and the drift well; and
a HV deep isolation well, wherein the HV deep isolation well encompasses the HV device well to isolate the HV device well from the bulk substrate.

11. The device of claim 1, wherein the HV top field oxide comprises:
a lower top field oxide portion, wherein the lower top field oxide portion is formed by the BOX layer; and
an upper top field oxide portion, wherein the upper top field oxide portion is formed by a trench isolation oxide used in forming a core isolation region which defines a core device region in the surface substrate.

12. The device of claim 11 wherein the HV top field oxide comprises an additional oxide over the upper HV top field oxide portion to increase a thickness of the HV top field oxide to a final thickness which is greater than a thickness of the BOX layer and the trench isolation oxide.

13. The device of claim 11 wherein a thickness of the HV top field oxide is about a same thickness as the BOX layer and the trench isolation oxide.

14. The device of claim 11 wherein a thickness of the HV top field oxide is less than a thickness of the BOX layer and the trench isolation oxide.

15. The device of claim 1 wherein a thickness of the HV top field oxide is less than a thickness of the BOX layer.

16. A method of forming a device, comprising:
providing a crystalline-on-insulator (COI) substrate, the COI substrate comprises
a surface substrate,
a bulk substrate,
a buried oxide (BOX) layer disposed between the surface substrate and the bulk substrate, the BOX layer isolates the surface substrate from the bulk substrate,
a high voltage (HV) device region comprising exposed bulk substrate below the BOX layer and surface substrate, the HV device region including a top field oxide on and in direct contact with a top bulk substrate surface of the bulk substrate, wherein the top field oxide comprises at least a part of the BOX layer; and
forming a HV transistor in the HV device region, forming the HV transistor includes:
forming a HV gate in the HV device region, wherein the HV gate is disposed on the top bulk substrate surface of the bulk substrate in the HV device region with a portion of the HV gate overlapping the top field oxide, and
forming first and second HV source/drain (S/D) regions in the bulk substrate, wherein
the first S/D region is displaced away from a first gate sidewall of the gate by the top field oxide, and
the second S/D region is adjacent to a second gate sidewall of the gate.

17. The method of claim 16, wherein providing the SOI COI substrate comprises defining the HV device region, wherein defining the HV device region comprises:
forming a core trench surrounding a core device region in the surface substrate and a HV trench in the surface substrate surrounding the HV device region, wherein the HV trench and the core trench expose the BOX layer;
filling the core trench and the HV trench with a trench isolation material to form a core trench isolation region and a HV trench isolation region surrounding the HV device region;
patterning the HV trench isolation region, wherein patterning the HV trench isolation region defines the HV device region with the HV device isolation region surrounding the HV device region and the top field oxide on the bulk substrate in the HV device region; and
wherein
the HV device isolation region comprises lower and upper HV device isolation portions, the lower HV device isolation portion is formed by the BOX layer and the upper HV device isolation portion is formed by the trench isolation material, and
the top field oxide comprises lower and upper top field oxide portions, the lower top field oxide portion is formed by the BOX layer and the upper top field oxide portion is formed by a top field isolation material which comprises the trench isolation material.

18. The method of claim 16, wherein the HV top field oxide comprises:
   a lower top field oxide portion, wherein the lower top field oxide portion is formed by the BOX layer; and
   an upper top field oxide portion, wherein the upper top field oxide portion is formed by a trench isolation oxide used in forming a core isolation region which defines a core device region in the surface substrate.

19. The method of claim 18, wherein the HV gate oxide and the core gate oxide are formed by the gate oxide and have a same thickness.

20. A method of forming a device, comprising:
   providing a crystalline-on-insulator (COI) substrate, the COI substrate comprises
      a surface substrate,
      a bulk substrate,
      a buried oxide (BOX) layer disposed between the surface substrate and the bulk substrate, the BOX layer isolates the surface substrate from the bulk substrate;
   defining a high voltage (HV) device region in the bulk substrate and a core device region in the surface substrate comprising:
      forming a core trench surrounding a core device region in the surface substrate and a HV trench in the surface substrate surrounding the HV device region in the bulk substrate, wherein the HV trench and core trench expose the BOX layer,
      filling the HV trench and core trench with a trench isolation material to form a HV trench isolation region and a core trench isolation region, and
      patterning the HV trench isolation region, wherein patterning the trench isolation region defines the HV device region with a HV device isolation region surrounding the HV region and a top field oxide is on and in direct contact with the bulk surface of the bulk substrate in the HV device region, wherein
         the HV device isolation region comprises lower and upper device isolation portions, the lower device isolation portion is formed by the BOX layer and the upper device isolation portion is formed by the trench isolation material, and
         the top field oxide comprises at least a part of the BOX layer; and
   forming a HV transistor in the HV device region, the HV transistor includes
      forming a HV gate in the HV device region in the bulk substrate, wherein the HV gate is disposed on the top bulk substrate surface of the bulk substrate in the HV device region and overlaps the top field oxide, and
      forming first and second HV source/drain (S/D) regions in the bulk substrate, wherein
         the first S/D region is displaced away from a first gate sidewall of the gate by the top field oxide, and
         the second S/D region is adjacent to a second gate sidewall of the gate.

* * * * *